(12) United States Patent
Harada

(10) Patent No.: US 7,282,768 B2
(45) Date of Patent: Oct. 16, 2007

(54) MOS FIELD-EFFECT TRANSISTOR

(75) Inventor: Hirofumi Harada, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 11/172,696

(22) Filed: Jul. 1, 2005

(65) Prior Publication Data
US 2006/0006470 A1    Jan. 12, 2006

(30) Foreign Application Priority Data
Jul. 6, 2004    (JP) .............................. 2004-198932

(51) Int. Cl.
*H01L 23/62*    (2006.01)
*H01L 29/76*    (2006.01)
(52) U.S. Cl. ...................... 257/356; 257/362; 257/402; 257/403

(58) Field of Classification Search ................ 257/356, 257/362, 402, 403
See application file for complete search history.

(56) References Cited

U.S. PATENT DOCUMENTS 3,999,212 A * 12/1976 Usuda .......................... 257/356
5,536,958 A *  7/1996 Shen et al. ................... 257/356

\* cited by examiner

*Primary Examiner*—Hung Vu
(74) *Attorney, Agent, or Firm*—Adams & Wilks

(57) ABSTRACT

A high-reliable depletion-type MOS field-effect transistor as a process monitor is provided. A diode formed in polycrystalline silicon and a diode formed in a semiconductor substrate form a bi-directional diode. The bi-directional diode connects a gate electrode with the semiconductor substrate in the depletion-type MOS field-effect transistor through metal wirings.

12 Claims, 4 Drawing Sheets

PRIOR ART

MOS FIELD-EFFECT TRANSISTOR

BACKGROUND OF THE INVENTION

1. Field of the Invention

The present invention relates to a MOS field effect transistor used as a process control monitor in a semiconductor integrated circuit.

2. Description of the Related Art

FIG. 2A is a schematic sectional view of a process control monitor composed of a conventional MOS transistor. First, a description will be made of the process control monitor with an enhancement type N-channel MOS transistor (hereinafter, abbreviated as an E-type NMOS) as an example. In the E-type NMOS, provided on a P-type semiconductor substrate 1 are an N-type source region 4, an N-type drain region 5, a gate insulating film 2, and a gate electrode 3. Also, provided are a source electrode terminal 4a, a drain electrode terminal 5a, and a gate electrode terminal 3a, each of which is intended to give a potential and is composed of a metal, and a substrate contact terminal 6a to fix a substrate potential.

Further, in a structure generally used for a process control monitor, one of the wirings of the gate electrode 3 is grounded to the P-type semiconductor substrate 1 through an N-type high-concentration region 7 (for example, refer to Introduction to VLSI Design, written by Matsuyama, Y. and Tomisawa, T., published by Kyoritsu Syuppan Co., Ltd. (p. 48)). The N-type high-concentration region 7 and the P-type semiconductor substrate 1 constitute a bulk diode which operates as a protective diode for the gate electrode. This provides an effect that the electrical charges which are charged in the gate electrode 3 in a manufacturing process are discharged to the P-type semiconductor substrate 1 through the bulk diode, which prevents the breakdown or deterioration of the gate insulating film 2 due to the charged electrical charges. This is effective against charging in the manufacturing process after the formation of metal electrode. The reason that the gate electrode 3 is grounded through a bulk diode in a reverse direction is that a positive voltage is applied to the gate electrode terminal 3a at the time of measuring the E-type NMOS. In order to prevent a gate current from flowing through the grounded part at the time of the voltage application, a diode is connected in a reverse direction. Such a protective diode for protecting the gate electrode can also be implemented in a PMOS besides an NMOS by inverting conductivity type.

FIG. 2B is a schematic sectional view of a depletion-type N-channel MOS transistor (hereinafter, abbreviated as a D-type NMOS). In this case, on the other hand, it is preferable not to dispose the above-described gate protecting diode. Since the threshold voltage of the D-type NMOS is negative, a forward bias condition is established at the gate protecting diode, which allows current to flow because the forward voltage, at which current starts flowing in a conventional bulk diode, is quite low, when a negative voltage is applied to the gate electrode terminal 3a.

However, when a protective diode is not formed for preventing the forward current flow, it is impossible to expel the charge in the gate electrode 3 charged in the manufacturing process. This often causes a breakdown of the gate electrode 3 and a shift in the threshold voltage due to charge damage. On the other hand, since the gate electrode almost always has a structure to contact with a diffusion region in a semiconductor integrated circuit including the D-type NMOS, such deterioration due to charge does not occur. In other words, when a bulk diode is attached to the gate electrode of a D-type NMOS transistor to avoid breakdown and deterioration, the transistor would not play a role as a process monitor for checking the condition of the element in the semiconductor integrated circuit.

SUMMARY OF THE INVENTION

To solve the aforementioned problems, the present invention provides a depletion-type MOS field effect transistor, comprising:

a P-type semiconductor substrate;

N-type high-concentration source/drain regions disposed on the semiconductor substrate;

a gate insulating film disposed on the semiconductor substrate;

a gate electrode comprised of a first polycrystalline silicon and disposed on the gate insulating film;

a PN junction diode disposed in a second polycrystalline silicon film which is disposed over the semiconductor substrate;

an intermediate insulating film disposed on the gate electrode, and on the second polycrystalline silicon film;

a first metal wiring connecting the gate electrode with an N-type region of the PN junction diode;

a second metal wiring connecting a P-type region of the junction diode with a high-concentration P-type region disposed on the semiconductor substrate; and a protective film comprised of a nitride film and disposed on the metal wirings.

A MOS field effect transistor is provided, further including a bi-directional diode provided in the second polycrystalline silicon film, the bi-directional diode being constituted by two P-type regions and an N-type region sandwiched therebetween, in which: the first metal wiring is connected with one of the P-type regions in the polycrystalline silicon; and the second metal wiring is connected with the other P-type region in the polycrystalline silicon.

A MOS field effect transistor is provided, further including a bi-directional diode provided in the second polycrystalline silicon film, the bi-directional diode being constituted by two N-type regions and an P-type region sandwiched therebetween, in which: the first metal wiring is connected with one of the N-type regions in the polycrystalline silicon; and the second metal wiring is connected with the other N-type region in the polycrystalline silicon.

A MOS field effect transistor is provided, further including a bi-directional diode provided in the second polycrystalline silicon film, the bi-directional diode being-constituted by an odd number, which is not less than three, of P-type regions and an even number of N-type regions sandwiched among the P-type regions, in which: the first metal wiring is connected with the P-type region at one of ends in the polycrystalline silicon; and the second metal wiring is connected with the P-type region at the other end in the polycrystalline silicon.

A MOS field effect transistor is provided, further including a bi-directional diode provided in the second polycrystalline silicon film, the bi-directional diode being constituted by an odd number, which is not less than three, of N-type regions and an even number of P-type regions sandwiched among the N-type regions, in which: the first metal wiring is connected with the N-type region at one of ends in the polycrystalline silicon; and the second metal wiring is connected with the N-type region at the other end in the polycrystalline silicon.

Further, in the depletion-type field effect-type MOS transistor, the N-type region exists on the P-type semiconductor substrate.

Further, in the depletion-type MOS field effect transistor, the protective film composed of the nitride film is not formed only on the second polycrystalline silicon film According to the present invention, the protective diode can be formed which has a small leak at the time of the application of the gate voltage, and thus, the depletion-type N-channel MOS transistor with high reliability can be provided. Further, the protective film opening portion is provided on the protective diode made of polycrystalline silicon. Thus, the protective diode can be cut, and therefore, the reliability of the gate insulating film can be checked. Accordingly, the process control monitor with high functions can be realized.

DETAILED DESCRIPTION OF THE PREFERRED EMBODIMENTS

Hereinafter, description will be made of embodiments of the present invention with reference to the accompanying drawings.

Embodiment 1

Figure 1:
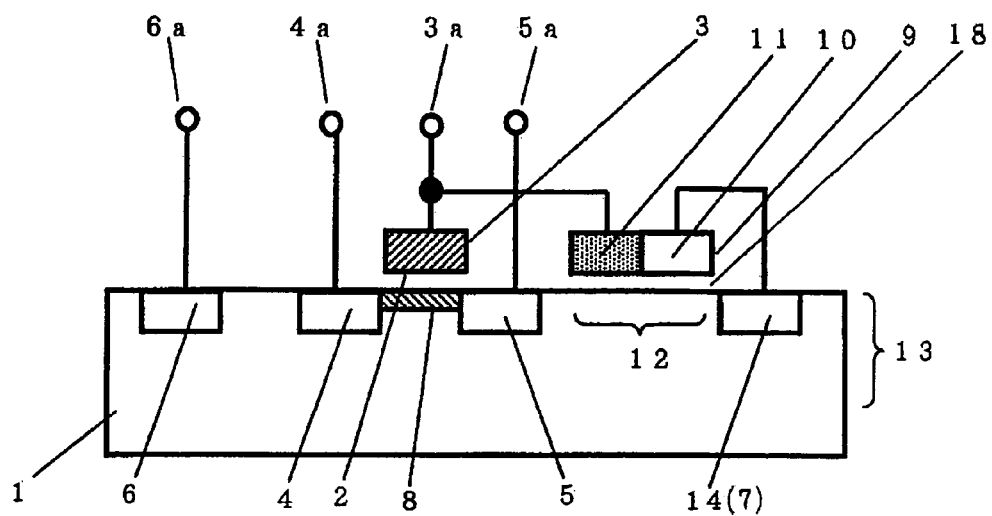
FIG. 1 is a schematic sectional view of a depletion-type N-channel MOS transistor in accordance with Embodiment 1.
Figure 2:
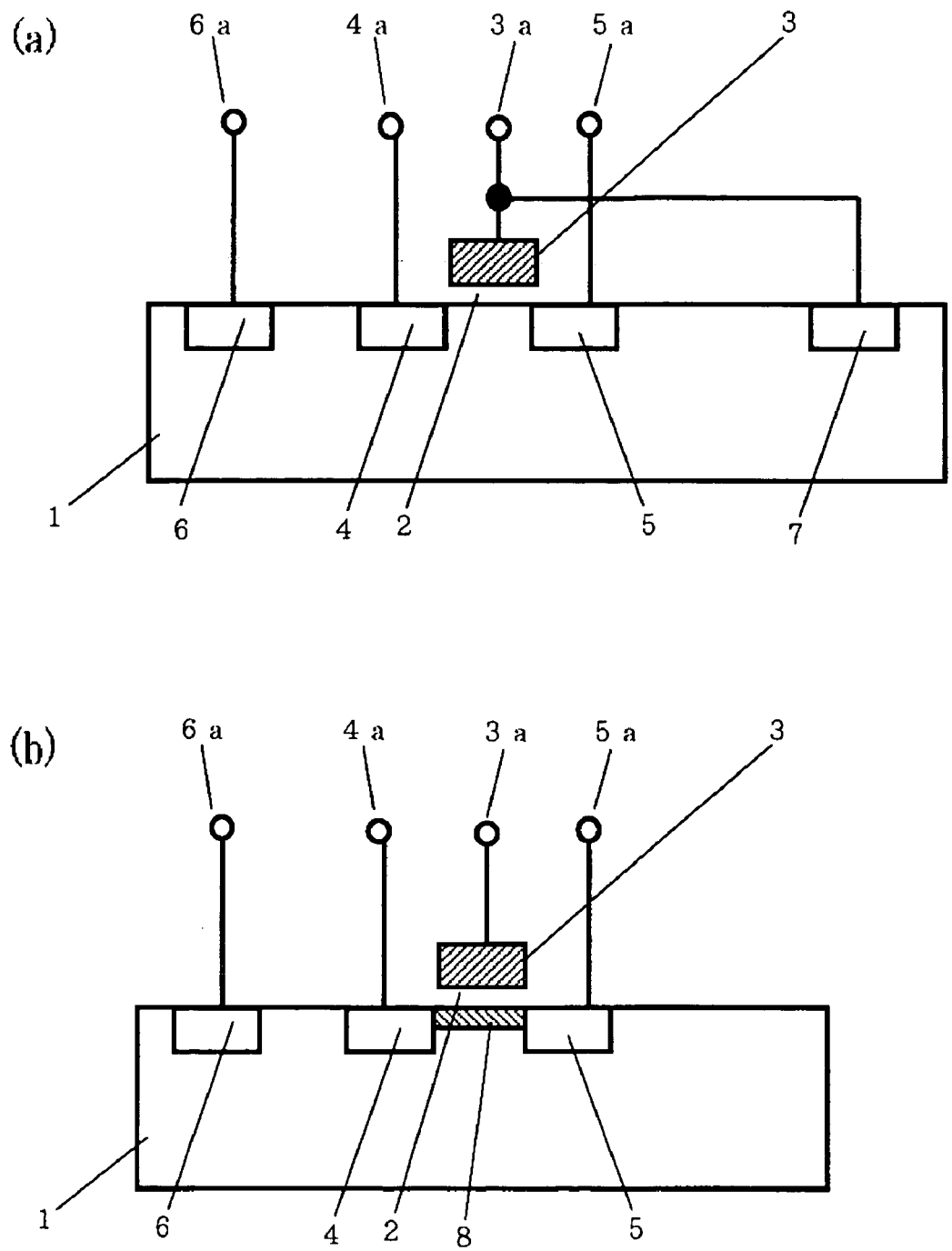
FIGS. 2A and 2B are a schematic sectional view of a conventional enhancement type N-channel MOS transistor and a schematic sectional view of a conventional depletion-type N-channel MOS transistor, respectively.

FIG. 1 shows Embodiment 1 according to the present invention, and shows a D-type NMOS constituted by a P-type semiconductor substrate 1, a gate insulating film 2, a gate electrode 3, and an N-type source/drain 4 and 5.

A second P-type high-concentration region 14 is provided in a region outside the transistor in the P-type semiconductor substrate 1 to form an ohmic contact with the P-type semiconductor substrate 1. Further, polycrystalline silicon is provided in another region outside the transistor, and a P-type high-concentration region 10 and an N-type high-concentration region 11 are disposed to form a polysilicon diode to be a protective diode 1 for the gate insulating film 2. Then, electrical connections by metal wiring are made between the gate electrode 3 and the N-type high-concentration region 11 made of polycrystalline silicon and between the P-type high-concentration region 10 made of polycrystalline silicon and the second P-type high-concentration region 14, respectively.

As described above, the protective diode 1 is inserted in series between the gate electrode 3 and the semiconductor substrate to discharge charges generated in a semiconductor manufacturing process. The usage of the polycrystalline silicon for the protective diode 1 provides a larger forward voltage than that of the conventional diode formed in the semiconductor substrate. Even in the case where a negative voltage is applied to the gate electrode terminal 3a, a leak current does not flow through the gate electrode terminal 3a as long as the negative voltage is less than the forward voltage.

On the other hand, in Embodiment 1 of FIG. 1, the following modification is possible: the second P-type high-concentration region 14 is changed for an N-type high-concentration region 7 to form a PN junction with the P-type semiconductor substrate 1; the junction is used as a protective diode 2 to the gate insulating film 2 and the polarity of the polycrystalline silicon diode is reversed, and the D-type NMOS gate side in the protective diode 1 is set to a P-type.

During the operation of the D-type NMOS, a gate voltage applied to the gate electrode terminal 3a ranges from a negative voltage to a positive voltage. In the case of the negative voltage, a reverse bias is established in the protective diode 1 while a forward bias is established in the protective diode 2. On the contrary, in the case of the positive voltage, the forward bias is established in the protective diode 1 while the reverse bias is established in the protective diode 2.

As described above, the reverse bias is always established in one of the protective diodes at the time of the application of the gate voltage. Thus, as long as the gate voltage is in a range of a reverse withstand voltage of either protective diode, the leak current does not flow through the gate terminal. Further, the D-type NMOS is manufactured such that the reverse withstand voltage of each protective diode is adjusted to be less than a dielectric breakdown voltage of the gate insulating film. As a result, the charges generated in the manufacturing process and a surge voltage at the time of measurement can be released. Therefore, a breakdown or a deterioration of the gate insulating film can be avoided.

The above-described structure can simultaneously solve the problems in the prior art, that is, the negative effects due to a leak current and charge-up.

A withstand voltage of the gate insulating film is determined by its thickness, and the reverse withstand voltage of each of the protective diodes is determined by a concentration of either P-type or N-type impurities for forming the diode. An optimum process design can, therefore, protect the gate insulating films with various thicknesses and withstand voltages.

Embodiment 2

Figure 3:
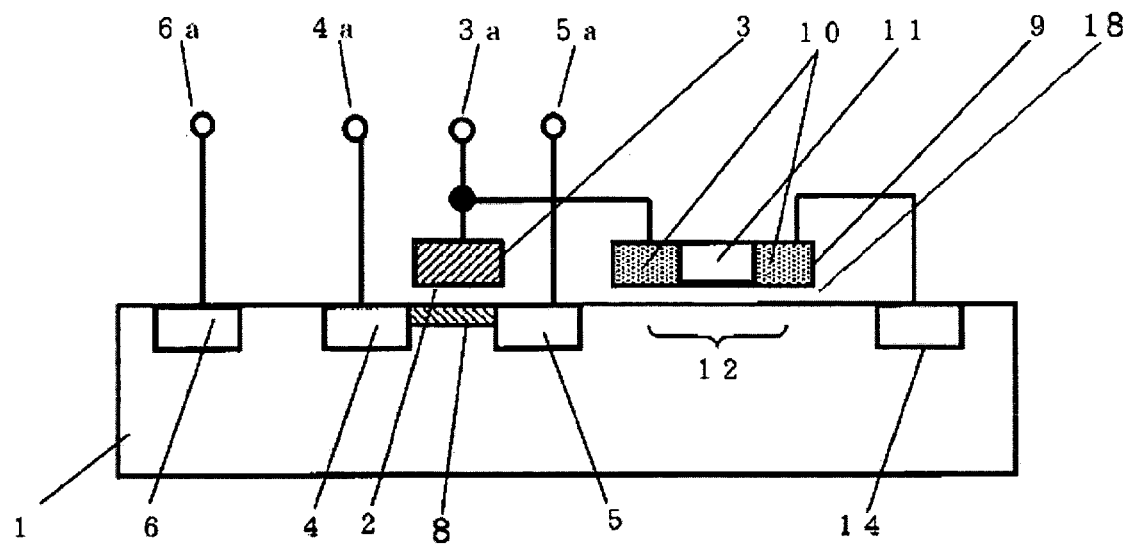
FIG. 3 is a schematic sectional view of a depletion-type N-channel MOS transistor in accordance with Embodiment 2.

Further, the same effects as those of Embodiment 1 are obtained also with the structure of Embodiment 2 of the present invention as shown in FIG. 3. In Embodiment 1 of FIG. 1, two diodes are disposed, the protective diode 2 formed on the semiconductor substrate and the protective diode 1 formed in the polycrystalline silicon form the diode. However, in FIG. 3, this function is realized by forming a polysilicon diode including a PNP structure in polycrystalline silicon. Then each of the P-type regions is connected with metal wiring, and one of the regions is connected to the P-type high-concentration region 14. Thus, a path is secured which releases charge to the wafer. The formation of a bi-directional diode in one element as described above has an advantage that the respective withstand voltages in two directions are easy to coincide.

When the respective withstand voltage in the bi-directional diode is to be increased, it is sufficient that the respective concentrations of the P-type region and the N-type region are adjusted. Thus, the number of parameters to be adjusted is fewer than that of Embodiment 1, which eases the process design.

Embodiment 3

Figure 4:
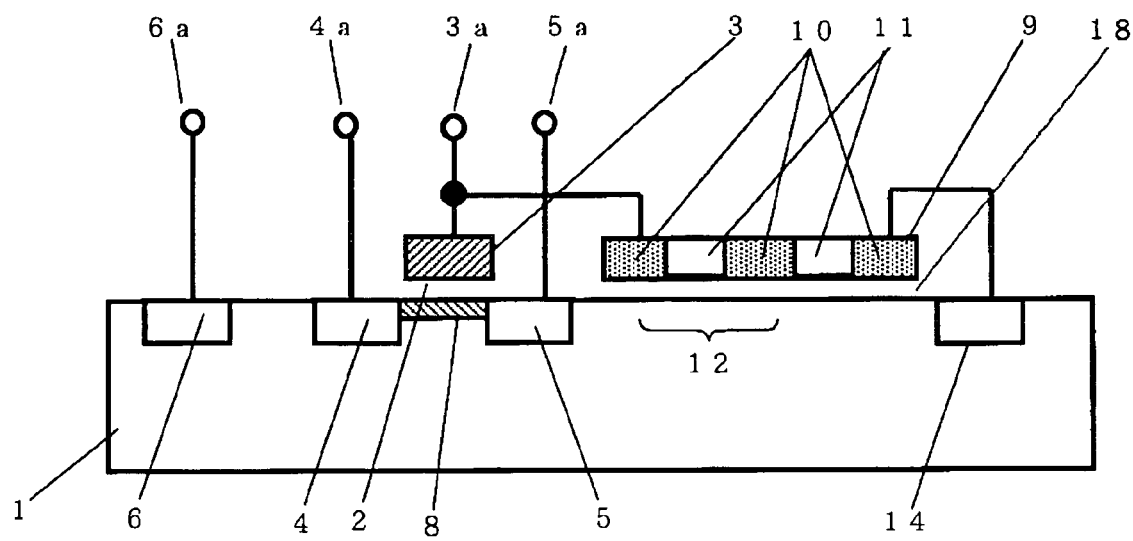
FIG. 4 is a schematic sectional view of a depletion-type N-channel MOS transistor in accordance with Embodiment 3.

Further, as regards Embodiment 3 in which a bi-directional diode is formed only of polycrystalline silicon as in Embodiment 2, the number of stages for series connection of P and N may be changed as shown in FIG. 4. With this structure, the withstand voltage of the diode is equal to the number of stages times a withstand voltage in a reverse junction. This method is sufficiently used for the case of a thick gate insulating film for a high withstand voltage.

Embodiment 4

The PNP structure is adopted as an example in FIGS. 3 and 4; however, an NPN structure can be also taken for realizing a bi-directional diode, and can be manufactured easily.

With the above-described structures according to the present invention, the formation of the protective diode for protecting the gate insulating film in the D-type MOS, which has been difficult to be realized in the conventional art, can be attained without damaging the transistor operation.

Embodiment 5

Figure 5:
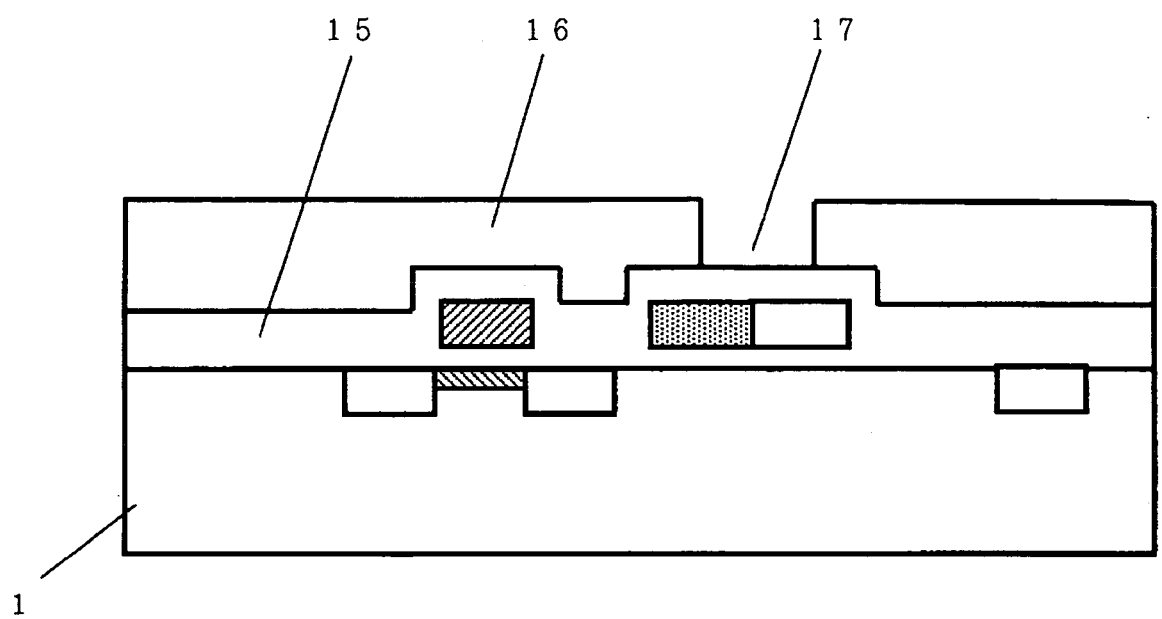
FIG. 5 is a schematic sectional view of a depletion-type N-channel MOS transistor in accordance with Embodiment 5.

FIG. 5 corresponds to a further embodiment besides the above embodiments. Here, an intermediate insulating film 15 composed of an oxide film and a final protective film 16 mainly composed of a plasma nitride film are additionally shown in Embodiment 1 of FIG. 1. A part of the protective film 16 on the protective diode 1 formed of polycrystalline silicon is removed as indicated by reference numeral 17. Through the opening 17 of the protective film the protective diode 1 formed of polycrystalline silicon is burned to cut the wiring through laser irradiation performed later.

Formation of a protective diode to the gate insulating film of a MOS field effect transistor is effective for preventing charging damage in the manufacturing process, but instead has a disadvantage if it is difficult to break the diode electrically and intentionally to measure the withstand voltage of the gate insulating film 2. In the case where the film quality and strength of the gate insulating film itself need to be checked, it is desirable that the strength is electrically checked. The present invention in FIG. 5 is provided as means for attaining such an object.

When cutting a wiring, polycrystalline silicon is preferable as a material that causes a little reflection of a laser and has a certain resistance to heat up easily, so the cutting can be easily realized in the structure disclosed in the present invention. Further, needless to say, the method of forming a protective film opening portion on the polycrystalline silicon protective diode can be easily applied to the respective structures of FIGS. 3 and 4 as well as the structure of FIG. 1.

What is claimed is:

1. A depletion-type MOS field effect transistor, comprising:
   a P-type semiconductor substrate;
   N-type high-concentration source/drain regions disposed on the semiconductor substrate;
   a gate insulating film disposed on the semiconductor substrate;
   a gate electrode comprised of a first polycrystalline silicon and disposed on the gate insulating film;
   a PN junction diode disposed in a second polycrystalline silicon film which is disposed over the semiconductor substrate;
   an intermediate insulating film disposed on the gate electrode, and on the second polycrystalline silicon film;
   a first metal wiring connecting the gate electrode with an N-type region of the PN junction diode;
   a second metal wiring connecting a P-type region of the junction diode with a high-concentration P-type region disposed on the semiconductor substrate; and
   a protective film comprised of a nitride film and disposed on the metal wirings.

2. A depletion-type MOS field effect transistor according to claim 1, wherein an opening of the protective film comprised of the nitride film is disposed on the second polycrystalline silicon film.

3. A depletion-type MOS field effect transistor, comprising:
   a P-type semiconductor substrate;
   N-type high-concentration source/drain regions disposed on the semiconductor substrate;
   a gate insulating film disposed on the semiconductor substrate;
   a gate electrode comprised of a first polycrystalline silicon and disposed on the gate insulating film;
   a bi-directional diode disposed in a second polycrystalline silicon film which is disposed over the semiconductor substrate, the bi-directional diode being constituted by two P-type regions and an N-type region sandwiched therebetween;
   an intermediate insulating film disposed on the gate electrode, and on the second polycrystalline silicon film;
   a first metal wiring connecting the gate electrode with one of the P-type regions in the second polycrystalline silicon;
   a second metal wiring connecting the other P-type region in the second polycrystalline silicon with a high-concentration P-type region disposed on the semiconductor substrate; and
   a protective film comprised of a nitride film and disposed on the metal wirings.

4. A depletion-type MOS field effect transistor according to claim 3, wherein an opening of the protective film comprised of the nitride film is disposed on the second polycrystalline silicon film.

5. A depletion-type MOS field effect transistor, comprising:
   a P-type semiconductor substrate;
   N-type high-concentration source/drain regions disposed on the semiconductor substrate;
   a gate insulating film disposed on the semiconductor substrate;
   a gate electrode comprised of a first polycrystalline silicon and disposed on the gate insulating film;
   a bi-directional diode disposed in a second polycrystalline silicon film which is disposed over the semiconductor substrate, the bi-directional diode being constituted by two N-type regions and a P-type region sandwiched therebetween;
   an intermediate insulating film disposed on the gate electrode, and on the second polycrystalline silicon film;

a first metal wiring connecting the gate electrode with one of the N-type regions in the second polycrystalline silicon;

a second metal wiring connecting the other N-type region in the second polycrystalline silicon with a high-concentration P-type region disposed on the semiconductor substrate; and a protective film comprised of a nitride film and disposed on the metal wirings.

6. A depletion-type MOS field effect transistor according to claim 5, wherein an opening of the protective film comprised of the nitride film is disposed on the second polycrystalline silicon film.

7. A depletion-type MOS field effect transistor, comprising:

a P-type semiconductor substrate;

N-type high-concentration source/drain regions disposed on the semiconductor substrate;

a gate insulating film disposed on the semiconductor substrate;

a gate electrode comprised of a first polycrystalline silicon and disposed on the gate insulating film;

a bi-directional diode disposed in a second polycrystalline silicon film which is disposed over the semiconductor substrate, the bi-directional diode being constituted by an odd number, which is not less than three, of P-type regions and an even number of N-type regions sandwiched among the P-type regions;

an intermediate insulating film disposed on the gate electrode, and on the second polycrystalline silicon film;

a first metal wiring connecting the gate electrode with the P-type region at one end of the bi-directional diode in the polycrystalline silicon;

a second metal wiring connecting the P-type region at the other end of the bi-directional diode in the polycrystalline silicon with a high-concentration P-type region disposed on the semiconductor substrate; and a protective film comprised of a nitride film and disposed on the metal wirings.

8. A depletion-type MOS field effect transistor according to claim 7, wherein an opening of the protective film comprised of the nitride film is disposed on the second polycrystalline silicon film.

9. A depletion-type MOS field effect transistor, comprising:

a P-type semiconductor substrate;

N-type high concentration source/drain regions disposed on the semiconductor substrate;

a gate insulating film disposed on the semiconductor substrate;

a gate electrode comprised of a first polycrystalline silicon and disposed on the gate insulating film;

a bi-directional diode disposed in a second polycrystalline silicon film which is disposed over the semiconductor substrate, the bi-directional diode being constituted by an odd number, which is not less than three, of N-type regions and an even number of P-type regions sandwiched among the N-type regions;

an intermediate insulating film disposed on the gate electrode, and on the second polycrystalline silicon film;

a first metal wiring connecting the gate electrode with the N-type region at one end of the bi-directional diode in the polycrystalline silicon;

a second metal wiring connecting the N-type region at the other end of the bi-directional diode in the polycrystalline silicon with a high-concentration P-type region disposed on the semiconductor substrate; and a protective film comprised of a nitride film and disposed on the metal wirings.

10. A depletion-type MOS field effect transistor according to claim 9, wherein an opening of the protective film comprised of the nitride film is disposed on the second polycrystalline silicon film.

11. A depletion-type MOS field effect transistor, comprising:

a P-type semiconductor substrate;

N-type high-concentration source/drain regions disposed on the semiconductor substrate;

a gate insulating film disposed on the semiconductor substrate;

a gate electrode comprised of a first polycrystalline silicon and disposed on the gate insulating film;

a PN junction diode disposed in a second polycrystalline silicon film which is disposed over the semiconductor substrate;

an intermediate insulating film disposed on the gate electrode, and on the second polycrystalline silicon film;

a first metal wiring connecting the gate electrode with a P-type region of the PN junction diode a second metal wiring connecting an N-type region of the junction diode with a high-concentration N-type region disposed on the semiconductor substrate and a protective film comprised of a nitride film and disposed on the metal wirings.

12. A depletion-type MOS field effect transistor according to claim 11, wherein an opening of the protective film comprised of the nitride film is disposed on the second polycrystalline silicon film.

* * * * *